United States Patent [19]

Ruckert et al.

[11] Patent Number: 4,764,450

[45] Date of Patent: Aug. 16, 1988

[54] POSITIVE-WORKING RADIATION-SENSITIVE COATING SOLUTION AND POSITIVE PHOTORESIST MATERIAL WITH MONOMETHYL ETHER OF 1,2-PROPANEDIOL AS SOLVENT

[75] Inventors: Hans Ruckert; Ralf Ohlenmacher, both of Wiesbaden, Fed. Rep. of Germany

[73] Assignee: Hoechst Aktiengesellschaft, Fed. Rep. of Germany

[21] Appl. No.: 946,621

[22] Filed: Dec. 29, 1986

Related U.S. Application Data

[63] Continuation of Ser. No. 742,063, Jun. 6, 1985, abandoned.

[30] Foreign Application Priority Data

Jun. 7, 1984 [DE] Fed. Rep. of Germany ....... 3421160
Mar. 21, 1985 [DE] Fed. Rep. of Germany ....... 3510220

[51] Int. Cl.$^4$ .......................... G03C 1/60; G03C 1/74
[52] U.S. Cl. ..................... 430/191; 430/165; 430/166; 430/169; 430/189; 430/192; 430/270; 430/271; 430/275; 430/277; 430/278; 430/279; 430/935
[58] Field of Search ............... 430/191, 192, 166, 165, 430/169, 331, 197, 270, 271, 935

[56] References Cited

U.S. PATENT DOCUMENTS

| | | | |
|---|---|---|---|
| 3,586,504 | 6/1971 | Coates et al. | 430/331 |
| 3,634,082 | 1/1972 | Christensen | 96/33 |
| 3,640,992 | 2/1972 | Sus et al. | 260/141 |
| 3,669,662 | 6/1972 | Agnihotri | 430/197 |
| 3,779,778 | 12/1973 | Smith et al. | 96/115 R |
| 3,868,254 | 2/1975 | Wemmers | 430/331 |
| 3,969,118 | 7/1976 | Stahlhofen et al. | 96/91 D |
| 3,977,884 | 8/1976 | Gulla et al. | 427/304 |
| 4,101,323 | 7/1978 | Buhr et al. | 96/35 |
| 4,247,611 | 1/1981 | Sander et al. | 430/286 |
| 4,248,957 | 2/1981 | Sander et al. | 430/270 |
| 4,250,247 | 2/1981 | Sander et al. | 430/270 |
| 4,266,001 | 5/1981 | Buhr et al. | 430/192 |
| 4,311,782 | 1/1982 | Buhr et al. | 430/270 |
| 4,411,983 | 10/1983 | Washizawa et al. | 430/325 |
| 4,416,976 | 11/1983 | Schell | 430/331 |
| 4,457,999 | 7/1984 | Stahlhofer | 430/191 |
| 4,487,823 | 12/1984 | Lehmann et al. | 430/56 |
| 4,506,003 | 3/1985 | Ruckert et al. | 430/270 |
| 4,510,227 | 4/1985 | Mohr et al. | 430/175 |
| 4,524,121 | 6/1985 | Gleim et al. | 430/156 |
| 4,550,069 | 10/1985 | Pampalone | 430/166 |
| 4,552,908 | 11/1985 | Nicks | 523/504 |
| 4,600,683 | 7/1986 | Greco et al. | 430/192 |
| 4,678,737 | 7/1987 | Schneller et al. | 430/910 |

FOREIGN PATENT DOCUMENTS 0164248 12/1985 European Pat. Off. .
739654 11/1955 United Kingdom .
1561438 2/1980 United Kingdom .

OTHER PUBLICATIONS

V. K. Rowe et al., "Toxicology of Mono-, Di-, and Tri-Propylene Glycol Methyl Ethers", *Chemical Abstracts*, Band 48, Nr. 22, 25, 13951f, Nov. 1954.
The Toxicology of Ethylene Glycol Monoalkyl Ethers and Its Relevance to Man, Technical Report No. 4--European Chemical Industry, 7/1982.

*Primary Examiner*—Charles L. Bowers, Jr.
*Attorney, Agent, or Firm*—Foley & Lardner, Schwartz, Jeffery, Schwaab, Mack, Blumenthal & Evans

[57] ABSTRACT

A positive-working radiation-sensitive coating solution is disclosed which contains a radiation-sensitive compound, e.g., a 1,2-naphthoquinone diazide, or a radiation-sensitive combination of compounds, e.g., a compound with at least one C—O—C bond which can be split by acid and a compound which upon radiation forms a strong acid, and at least one organic solvent which comprises a mono-$C_1$ to $C_4$-alkyl ether of 1,2-propanediol. The coating solution is less toxic and results in a better layer leveling than known positive-working photoresist solutions.

13 Claims, No Drawings

POSITIVE-WORKING RADIATION-SENSITIVE COATING SOLUTION AND POSITIVE PHOTORESIST MATERIAL WITH MONOMETHYL ETHER OF 1,2-PROPANEDIOL AS SOLVENT

This application is a continuation of application Ser. No. 742,063, filed June 6, 1985, abandoned.

BACKGROUND OF THE INVENTION

The present invention relates to a positive-working radiation-sensitive coating solution which is particularly suitable for preparing photoresist layers.

Positive-working photoresist solutions are known which are based on naphthoquinone diazides or on a combination of compounds which can be split by acid and compounds which, on exposure to actinic radiation, form a strong acid, respectively. Such photoresist solutions are widely used in the production of printed circuits and microelectronic components, and for chemical milling and the like.

In these applications, the photosensitive coating solutions are normally supplied by manufacturers, and the users then apply the solutions to an appropriate layer support, for example, silicon wafers or copper-laminated plates of an insulating material, whereafter the layers are dried. Such single coating methods are more difficult to perform and more susceptible to trouble than the industrial coating of endless supports in continuous processes, which is customary in the production of presensitized printing plates or dry resist films. When individual supports are coated by the user, it is always more difficult to maintain exactly reproducible standard coating conditions.

The problems arising in this context are caused not only by the type and amount of the solid layer constituents but also to a considerable extent by the type of solvent (usually organic) employed. Since many users, who only coat small numbers of supports, do not possess installations for a recovery or environmentally safe disposal of the solvent vapors, only solvents which are not injurious to health are permitted. As standards governing the use of organic solvents in laboratories have become considerably more strict in recent times, the choice of solvents has become severely limited.

Nevertheless, most of the commercially available photoresist solutions used in practice contain a solvent mixture. This is true because a suitable photoresist solution must dry to give a layer which is as uniform as possible and free from streaks, even when the temperatures and drying conditions are not identical in all cases. Attempts to achieve this objective have usually involved providing a solvent mixture comprised of several components, each having a different solvency characteristic relative to the layer constituents. Each component of the typical solvent mixture also possesses a different evaporation number, so that a gradual solidification of the layer takes place in the course of the drying process and inhomgeneities due to a premature separation of individual constituents are thereby avoided.

U.S. Pat. No. 3,634,082 teaches that ethylene glycol monomethyl ether, ethylene glycol monoethyl ether, aliphatic esters (e.g., butyl acetate), aliphatic ketones (e.g., methyl-isobutyl ketone and acetone), dioxane, xylene and halogenated aromatic compounds (e.g., chlorinated xylene, benzene and toluene) are suitable solvents for positive-working photoresist solutions based on 1,2-quinone diazides. Essentially the same solvents are employed for positive-working photoresist mixtures based on compounds which can be split by acid, as described, for example, in U.S. Pat. No. 4,101,323 and in European Patent Application No. 42,562.

In general, the main constituents of technical-grade photoresist solutions are ethylene glycol derivatives, such as monomethyl and monoethyl ethers, the corresponding ethers of diethylene glycol or ethylene glycol ethyl ether acetate. These solvents display good solvent powers for all customary layer components, favorable boiling points and evaporation numbers, and reasonable prices. However, the layers obtained using these compositions are not in all cases faultless. Moreover, the permissible values for their concentration in atmosphere of industrial laboratories have recently been reduced.

SUMMARY OF THE INVENTION

It is therefore an object of the present invention to provide a photoresist solution that employs solvents which compare favorably, with respect to boiling point, vapor pressure, solvency characteristics and price, to solvents used heretofore in the art, but that additionally results in improved layer qualities and fewer risks to health.

It is another object of the present invention to provide a photoresist displaying enhanced layer uniformity and a decrease in streaks.

In accomplishing the foregoing objects, there has been provided, in accordance with one aspect of the present invention, a positive-working radiation-sensitive coating solution comprising at least one radiation-sensitive compound and an organic solvent which comprises a mono-$C_1$ to $C_4$-alkyl ether of 1,2-propanediol. In one preferred embodiment, the ether of the aforesaid coating solution is a monomethyl ether of 1,2-propanediol.

In accordance with another aspect of the present invention, there has been provided a photoresist material comprising a support and a light-sensitive layer provided thereon, which light sensitive layer is comprised of the above-described coating solution.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

The coating solution of the present invention contains a glycol ether which is a mono-$C_1$ to $C_4$-alkyl ether of 1,2-propanediol. Preferably, the glycol ether is a mono-$C_1$ or $C_2$-alkyl ether, particularly a monomethyl ether.

The alkyl ether group can be in the 1-position or in the 2-position of the propanediol. In the case of monomethyl ether, the more easily accessible 1-methoxy-propan-2-ol is generally preferred. It is also possible to use mixtures of the two methyl isomers and/or mixtures of the mono-$C_1$ to $C_4$-alkyl ethers of propanediol.

The above-mentioned solvents are commercially available. Their maximum allowable concentrations in the ambient atmosphere of industrial laboratories are higher than the maximum concentrations of the ethylene glycol ethers used to date. It is also of great advantage that, in many cases, coating solutions of the present invention which contain the solvents mentioned above have more uniform leveling properties and provide more homogeneous layers, especially if these solvents are the only solvents used in the coating, than do solutions comprising the corresponding ethers of ethylene glycol.

The advantageous properties of a coating solution within the present invention are retained when part of the propanediol mono-alkyl ether is replaced by other customary auxiliary solvents, such as esters, like butyl acetate; hydrocarbons, such as xylene; ketones, like acetone and butanone; alcohols and certain alkoxyalkyl esters, e.g., 3-methoxy-butyl acetate. If desired, the wetting, flow and evaporation characteristics of the solution can be modified in this way on a case-by-case basis. The added amount of these additional solvents should in any event be less than 50% by weight. Preferably, their amount is 0 to 35% by weight, in particular 0 to 20% by weight, relative to the weight of the solvent mixture. Accordingly, the solvent or solvent mixture of this invention contains 65 to 100% by weight of a 1,2-propanediol mono-$C_1$ to $C_4$-alkyl ether, preferably of a 1,2-propanediol monomethyl and/or monoethyl ether. In most cases, it is expedient to employ no other solvents except alkoxypropanol.

It is also possible to increase the flexibility of the layer by adding higher-boiling alcohols or ethers, small quantities of which (for example, about 1 to 2%) remain in the layer after drying. If desired, the rate of evaporation can be accelerated by adding a lower-boiling solvent, such as, for example, sec-butanol.

The photoresist solution of the present invention can be applied in a known manner to a support to be coated, for example, by immersion, slot-die-coating, spin-coating, spray-coating, roller-coating, or curtain coating.

In most cases it is expedient to use no other solvent than the alkoxypropanol.

The total solids content of the solution according to the present invention generally varies between 10 and 50% by weight, preferably between 15 and 35% by weight, depending on the types of photosensitive compounds and binders used in each case and on the intended use.

The coating solutions of the present invention also contain a radiation-sensitive (photosensitive) compound or combination of compounds. Positive-working compounds, i.e., compounds which are rendered soluble by exposure, are suitable for the present invention. They include 1,2-quinone-diazides and combinations of photolytic acid donors and compounds which can be split by acid, such as ortho-carboxylic acid compounds and acetal compounds.

Suitable 1,2-quinone-diazides are described, for example, in German Patentschriften Nos. 938,233 and 1,543,271, and in German Offenlegungsschriften Nos. 2,331,377, 2,547,905 and 2,828,037. The preferred 1,2-quinone-diazides are naphthoquinone-(1,2)-diazide-(2)-4- or -5-sulfonic acid esters or amides. Amongst these, esters, in particular those of the sulfonic acids, are particularly preferred. In general, the quantity of 1,2-quinone-diazide compounds is 3 to 50% by weight, preferably 7 to 35% by weight, relative to the non-volatile constituents of the mixture.

Coating solutions based on compounds which can be split by acid are also known and are described, for example, in U.S. Pat. Nos. 3,779,778 and 4,101,323, in German Patentschrift No. 2,718,254, and in German Offenlegungsschriften Nos. 2,829,512 and 2,829,511. The compounds which can be split by acid in such solutions include ortho-carboxylic acid derivatives, monomeric or polymeric acetals, enol ethers or acyliminocarbonates. As the compounds which are sensitive to radiation and which eliminate acid, the coating solutions predominantly contain organic halogen compounds, in particular s-triazines which are substituted by halogenomethyl groups or 2-trichloromethyl-1,3,4-oxadiazoles. Among the orthocarboxylic acid derivatives described in U.S. Pat. No. 4,101,323, the bis-1,3-dioxan-2-yl ethers of aliphatic diols are particularly preferred. Among the polyacetals described in German Patentschrift No. 2,718,254, those with aliphatic aldehyde and diol units are preferred.

In German Offenlegungsschrift No. 2,928,636, very suitable mixtures are also described which contain, as compounds which can be split by acid, polymeric ortho-esters with recurrent ortho-ester groups in the main chain. These groups are 2-alkyl ethers of 1,3-dioxacycloalkanes having 5 or 6 ring members. Polymers with recurrent 1,3-dioxa-cyclohex-2-yl alkyl ether units, in which the alkyl ether group can be interrupted by ether oxygen atoms and bonded to the 5-position of the adjacent ring, are particularly preferred.

The amount of compound which can be split by acid in the photosensitive mixture of the present invention is in the range of about 8 to 65% by weight, preferably between about 14 and 44% by weight, relative to the non-volatile constituents of the mixture. The quantity of the compound which eliminates acid is between about 0.1 and 10% by weight, preferably between about 0.2 and 5% by weight.

In addition to the above-described photosensitive constituents, the coating compositions according to the present invention may contain polymeric binders. Preference is given to polymers which are insoluble in water, but soluble or swellable in aqueous-alkaline solutions.

Suitable binders which are soluble or swellable in alkaline media include natural resins, such as shellac and colophony and synthetic resins, such as copolymers of styrene and maleic acid anhydride or copolymers of acrylic or methacrylic acid, particularly with acrylic and methacrylic acid esters, and, in particular, novolaks. Of the novolak condensation resins, the more highly condensed resins with substituted phenols as the partners for condensation with formaldehyde have proved especially useful. The type and quantity of the alkali-soluble resins can vary depending on the intended use; preferably, the proportions of the resins in the total solids are 30 to 90% by weight, in particular 55 to 85% by weight.

In lieu of, or in a mixture with, the novolaks, phenol resins of the poly(4-vinyl-phenol) type can also be employed with advantage. Moreover, numerous other resins can be used in admixture. Preferably these are vinyl polymers, such as polyvinyl acetates, polyacrylates, polyvinyl ethers and polyvinylpyrrolidones, which again can be modified by comonomers. The most advantageous proportion of these resins depends on the technological requirements and on the influence on the development conditions desired. In general, the amount used should not be more than about 20% by weight of the alkali-soluble resin. To meet special requirements, such as flexibility, adhesion, gloss and the like, the light-sensitive mixture can additionally contain small amounts of substances, such as polyglycols, cellulose derivatives, such as ethylcellulose, surfactants, dyes, and finely particulate pigments, and UV absorbers, if desired.

The solutions according to the present invention can be coated onto all support materials that are customary in photoresist technology, such as copper-laminated plates of an insulating material, copper cylinders for gravure printing, nickel cylinders for screen printing, aluminum plates, glass plates, and the silicon, silicon nitride and silicon dioxide surfaces employed in microelectronics. By applying the coating solutions according to the present invention, for example, to plates of zinc, brass/chromium, aluminum/copper/chromium, aluminum or steel, it is also possible to obtain letterpress and offset printing plates.

Coated photosensitive materials exemplified above can be exposed by means of conventional light sources, the emission maxima of which are in the long-wave UV range or in the short-wave visible range. Imaging can also be effected using electron, x-ray or laser beams.

The aqueous-alkaline solutions which can be used for developing have graduated alkalinity, i.e., they have a pH which preferably is between about 10 and 14, and they can also contain minor amounts of organic solvents or surfactants. Suitable developers remove those areas of the copying layer which have been struck by light, and thus produce a positive image of the original.

The following examples illustrate preferred embodiments of the present invention. Unless otherwise stated, proportions and percentages denote weight units. Parts by weight (p.b.w.) and parts by volume (p.b.v.) have the same relationship as g and cm$^3$.

EXAMPLE 1

This example illustrates the production by electroplating of rotary nickel screen printing stencils suitable for the printing of textiles.

A solution was prepared from
- 15 p.b.w. of butanone
- 45 p.b.w. of 1-methoxy-propan-2-ol (Dowanol PM, Dow Chem. Co., USA),
- 28 p.b.w. of a cresol/formaldehyde novolak having a softening range of 105°–120° C. (according to DIN 53,181),
- 3.5 p.b.w. of polyvinyl ether (Lutonal A 25)
- 8.3 p.b.w. of the polyacetal of 2-ethylbutyraldehyde and triethylene glycol,
- 0.2 p.b.w. of 2-(6-methoxy-naphth-2-yl)-4,6-bis-trichloromethyl-s-triazine, and
- 0.01 p.b.w. of crystal violet base.

A 60 μm to 75 μm thick layer of good surface quality was coated onto a bright, slightly contractible nickel cylinder provided with a conductive stripping layer, the coating being performed in two steps, with an intermediate drying step, by spray coating using compressed air. The rotating cylinder was then fully dried by means of infrared radiators for about 30 minutes. The leveling time of the solution up to complete drying, as well as the layer thickness, could be varied by reducing the butanone content of the solution. Even when the coating solution contained no butanone, a layer of good surface quality was obtained.

When a mixture comprised of 40 p.b.w. of butanone, 15 p.b.w. of β-ethoxy-ethyl acetate and 5 p.b.w. of 2-(β-ethoxy-ethoxy)ethanol was used as the solvent for the above coating composition, the layer quality was also good. It was impossible, however, to achieve a layer of an equally good quality when one of the aforesaid solvents was used under practical conditions.

The coated nickel cylinder was then appropriately exposed under a positive master of the pattern to be printed. The tonal values of the master had been transformed into image portions of differing visual densities by means of a screen having 32 lines per cm. A positive-working layer based on 1,2-naphthoquinone diazide and having half the thickness of the layer described above required four times more exposure time. Development was performed with a solution of
- 0.5% of NaOH
- 0.8% of sodium metasilicate×9 H$_2$O and
- 1.0% of ethylene glycol mono-n-butyl ether in
- 97.7% of deionized water.

For this purpose, the rotating, exposed cylinder was immersed in an appropriately sized vessel which had been half-filled with the developer liquid. The overdevelopment resistance of the layer prepared in accordance with the present invention was very good, thus making possible the formation of steep resist edges. The cylinder was allowed to rotate in the developer for 6 minutes, after which the developer vessel was removed and the cylinder rinsed with water and air-dried.

In the bared areas of the cylinder core, nickel was electrodeposited up to a thickness of 0.1 mm. Then the cylinder core was contracted, the resist stencil was stripped with acetone and pulled away from the core, and an elastic rotary printing stencil was obtained. Through the holes of the rotary stencil, ink was applied in imagewise manner to the textiles to be printed.

Similar results were obtained when the polyacetal of n-heptanal and tetraethylene glycol was used as the acid-cleavable compound.

EXAMPLE 2

This example illustrates an application, by means of a roller coater, of the coating solution according to the present invention in the production of high-resolution printed circuit boards.
- 64 p.b.w. of the novolak of Example 1,
- 11 p.b.w. of polyvinylmethyl ether (Lutonal M 40),
- 15 p.b.w. of a polyacetal of 2-ethylbutyraldehyde and hexane-1,6-diol,
- 9.5 p.b.w. of the polyorthoester of trimethoxymethane and 5-oxa-7,7-dihydroxymethyl-nonan-1-ol,
- 0.4 p.b.w. of 2-acenaphth-5-yl-4,6-bis-trichloromethyl-s-triazine, and
- 0.1 p.b.w. of crystal violet base were dissolved in 1-methoxypropan-2-ol to give a solution having a solids content of 30%. A coating solution having a viscosity of about 90 mm$^2$/s was obtained. A corresponding solution with a solids content of 40% had a viscosity of about 200 mm$^2$/s. When the 1-ethoxy-propanol-2 form (Ethoxypropanol EP, Deutsche BP Chemie GmbH) was used instead of 1-methoxypropanol-2, the 40% coating solution had a viscosity of about 320 mm$^2$/s.

When a coating solution as described above was applied by roller application, using a type AKL 400 roller coater (commercially available from Messrs. Buerkle, Freudenstadt, Federal Republic of Germany) which is suitable for double-sided coating and equipped with fluted rollers having 48 or 64 flutes per 2.5 cm (linear), to through-hole plated copper-laminated plates of an insulating material, dry layer thicknesses of about 3 to 14 μm were achieved in one coating step, depending on the resist solution, fluted roller and machine adjustment employed in each case. The leveling and drying times could also be influenced by an appropriate selection of 1-methoxy- or 1-ethoxy-propanol-2, or mixtures thereof, depending on the desired duration of the processing cycles.

The leveling and drying properties achieved with the above-described coating solution were good, comparing favorably to the properties obtained with the same mixture of solids dissolved in a conventional solvent mixture of β-ethoxy-ethyl acetate, xylene, β-butyl acetate and, optionally, an o,p-cholorotoluene mixture.

In accordance with a selective plating technique, the plate was exposed after drying under a negative original which corresponded to the hole areas. The exposed areas were thereafter washed out with the developer of Example 1, and the plate was dried for 10 minutes at a temperature of 80° C. The plate was then reinforced with copper by electroplating and tinned by electroplating. The photoresist layer was exposed under a positive conducting-path original and developed as described above. The bared copper was then etched away with an alkaline etching agent.

If a softer consistency and higher flexibility of the photoresist layer was desired, a mixture of 85% of 1-methoxy-propan-2-ol and 15% of 2-ethyl-butanol could be employed instead of the single solvent used above. A small amount (up to 2%) of the higher-boiling solvent would then remain in the layer after drying and act as plasticizer. Similar results can be achieved by adding 10% of 3-methoxy-butanol or 20% of 3-methoxybutyl acetate. 1-isobutoxy-propanol-2 (iBP, produced by Deutsche BP-Chemie) could also be used as an admixture constituent.

EXAMPLE 3

In an electrostatic spray device, a glass plate for the production of LCD elements, which plate was provided with an indium-tin oxide layer, was coated with a solution comprised of 12 p.b.w. of the novolak of Example 1,
10 p.b.w. of a 50% strength solution of polyvinyl methyl ether in toluene, and
4 p.b.w. of the 1,2-naphthoquinone-2-diazide-4-sulfonic acid ester of 4-(2-phenylprop-2-yl) phenol, in
74 p.b.w. of a mixture composed of equal parts of 1-methoxy-propan-2-ol and 2-methoxy-propan-1-ol (Dowanol PM and Solvenon PM, made by BASF AG), by the method described below:

A defined quantity of the coating solution was distributed by spraying with (1) a high-speed rotary bell, which had a diameter of 60 mm, and (2) a pump, at 40,000 rpm and 100 kV direct voltage. The bell was arranged at a distance of 30 cm from the coating table, over which the grounded glass plate was guided. Under the above-stated conditions, the flow of current was less than 1 mA. By varying the advance speed between 0.8 and 2 m per minute and the rpm of the pump, dry layer thicknesses between about 4 μm and 10 μm could be obtained. When layer thicknesses of about 5 μm were desired, it was expedient to adjust the concentration of the solution to 15%, if appropriate, by adding a higher-boiling solvent.

After drying, exposure was performed under a positive original representing the feed lines of the display fields of a revolution counter. Development was then carried out with the solution of Example 1, and finally the indium tin oxide was removed from the bared areas by etching with 5% strength hydrochloric acid.

EXAMPLE 4

The following positive-working photoresist solution was used for applying high-resolution circuit patterns to a silicon wafer.

A solution containing
76 p.b.w. of 1-methoxy-propan-2-ol,
13.6 p.b.w. of the novolak of Example 1,
6.6 p.b.w. of 1,3-bis-[2-(5-ethyl-5-butyl-1,3-dioxacyclohexoxy)]-2-ethyl-2-butyl propane,
1.1 p.b.w. of the triazine of Example 2, and
2.7 p.b.w. of polyvinyl ether (Lutonal A 25).

was applied to a silicon wafer by spin-coating at 6,000 rpm and dried in a circulating air cabinet to obtain a storable, positive-working, presensitized wafer. The light-sensitivity of the wafer was increased several times over conventional positive-working photoresist layers of the same thicknesses which are based on o-naphthoquinone diazides. A comparative test with the commercially available, o-quinone diazide-based photoresist AZ 1350J, which is widely used in the field of microelectronics, was conducted under the same conditions as in Example 1, except that a filter extending the exposure time was interposed, resulting in an exposure time of 3 seconds for the non-diazo layer and of 20 seconds for the diazo layer. The two exposure times were optimally adapted for achieving good resolution up to about field 3/2 of the ITEK test original, with a developing time of 1 minute in the developer solution of Example 1. Striation structures which may form during the spin-coating step could be avoided by adding a polysiloxane or fluorine surfactant according to European Patent Application Nos. 42,104 and 42,105, just as in the case of the AZ 1350J photoresist. A similar coating quality is achieved when 1-ethoxypropanol-2 was used instead of 1-methoxypropanol-2.

EXAMPLE 5

In the preparation of positive-working photoresist solutions for producing autotypic copper gravure cylinders, 12 p.b.w. of the novolak of Example 1,
1 p.b.w. of a copolymer composed of 95% of vinyl acetate and 5% of crotonic acid,
2 p.b.w. of an ester mixture condensed from 1 mol of 2,3,4-trihydroxybenzophenone and 2 mol of 1,2-naphthoquinone-2-diazide-5-sulfonic acid chloride, and
0.1 p.b.w. of crystal violet base were dissolved with stirring in
85 p.b.w. of 1-methoxy-propan-2-ol.

A comparison solution was prepared from
24 p.b.w. of the above novolak,
2 p.b.w. of the above copolymer,
4 p.b.w. of the above ester mixture, and
0.2 p.b.w. of crystal violet base, in
49 p.b.w. of trichloroethane,
14 p.b.w. of isopropanol,
7 p.b.w. of butyl acetate, and
100 p.b.w. of 2-ethoxy-ethanol, and the two solutions were each applied, by means of a spray gun, to half of a freshly copper-plated rotating copper cylinder, respectively, until a layer thickness of about 4 μm was obtained. The layers were then dried with hot air or infrared radiators. When the two coated halves were examined, it was found that the layer produced with the solution of the present invention was much smoother and more homogeneous, and had better leveling characteristics, than the comparison layer. The respective layers were then exposed under a half-tone negative of the pattern to be printed, and the copper surface was laid bare in imagewise fashion by pouring 0.8% strength sodium hydroxide onto the slowly rotating cylinder. With the above-described layers, this process step took 2 to 4 minutes. Thereafter, the cylinder was rinsed with water and dried with hot air while the cylinder was rotated.

Prior to the customary gravure etching with a solution of ferric chloride, the two layer portions to be compared were touched up by correcting them mechanically with a graver and by applying marks and additional lines. With both layers, similarly, good results were achieved, because after drying both layers still contain about 1% of residual solvent, which in the comparison layer essentially comprised toxic 2-ethoxyethanol.

EXAMPLE 6

This example illustrates the use of a coating solution according to the present invention in the production of an offset printing form.

A coating solution containing 7 p.b.w. of the novolak of Example 1, 2 p.b.w. of 2-(naphth-2-yloxy)-5,5-dimethyl-1,3-oxazolin-4-one, 0.4 p.b.w. of 2-(4-methoxy-anthrac-1-yl)-4,6-bis-trichloromethyl-s-triazine, and 0.1 p.b.w. of 4-diethylamio-azobenzene, in 90.8 p.b.w. of 1-methoxy-propan-2-ol, was applied, by roller coating, onto an aluminum substrate which had been roughened on one side by means of wire brushes. The aluminum surface was readily and uniformly wetted with the solution, and the applied layer maintained its homogeneous character until it was completely dry. For an accelerated drying, up to 15% of the solvent could be replaced by sec-butanol. For a prolonged drying, all or part of the 1-methoxy-propanol-2 could be replaced by 1-ethoxy-propanol-2.

The resulting layer had a thickness corresponding to a weight of 2 g/m².

After drying, the plate was exposed under a positive original, developed with a 3.5% strength aqueous solution of trisodium phosphate which had a pH adjusted to 12.6 by the addition of sodium hydroxide, rinsed with water, and finally made ready for printing by wiping with 1% strength phosphoric acid. Even when the plate was left in the developer solution 12 times longer than required for development, practically no defects were apparent in the image areas. Thereafter, the plate was used for printing, and it accepted ink very readily.

EXAMPLE 7

With the same solid components as in Example 1, dissolved in 1-ethoxy-propanol-2 to give a 40% strength solution, a system suitable for electrostatic spray coating under conditions similar to those of Example 3 was prepared (bell distance 20 cm, high voltage 80 kV). The solution was first adjusted to a solids content of 26% by weight by diluting it with 3-methoxy-butanol-1. After drying, the layer had a weight of about 5 g/m². On supports of aluminum and copper, the layer exhibited good leveling properties.

The resist solution could be used for spray coating even with a remarkably high solids content. The addition of up to about 5% of isobutoxy-propanol was possible without a requisite change in the spray conditions.

What is claimed is:

1. A positive-working radiation-sensitive coating solution suitable as a photoresist, consisting essentially of, in admixture, (i) at least one polymeric binder which is soluble or swellable in alkaline media and soluble in monomethyl ether of 1,2 propanediol said binder being present in an amount between about 30 and 90 percent by weight, relative to the total solids of said coating solution; (ii) a sufficient amount of at least one radiation-sensitive compound to impart radiation sensitivity to said coating solution; and (iii) an organic solvent present in an amount sufficient to solubilize said binder, which organic solvent consists essentially of a monomethyl ether of 1,2 propanediol in an amount of between about 80% and 100% by weight of said organic solvent.

2. A coating solution as claimed in claim 1, wherein said radiation-sensitive compound is a 1,2-naphthoquinone-2-diazide.

3. A coating solution as claimed in claim 1, comprising a radiation-sensitive combination of
   (a) a compound containing at least one C—O—C bond which can be split by acid and
   (b) a compound which upon irradiation forms a strong acid.

4. A coating solution as claimed in claim 1, wherein said polymeric binder comprises a novolak.

5. A coating solution as claimed in claim 1, wherein said organic solvent comprises 1-methoxypropane-2-ol.

6. A coating solution as claimed in claim 1, wherein said organic solvent consists essentially of said ether.

7. A coating solution as claimed in claim 6, wherein said organic solvent consists of said ether.

8. A coating solution as claimed in claim 1, said coating solution consisting essentially of said components (i), (ii) and (iii).

9. A photoresist material, comprising a support and a light-sensitive layer provided on said support, said layer being the product of a process comprising the step of coating said support with a positive-working radiation-sensitive coating solution which is suitable as a photoresist and which consists essentially of, in admixture, (i) at least one polymeric binder which is soluble or swellable in alkaline media and soluble in monomethyl ether of 1,2 propanediol said binder being present in an amount between about 30 and 90 percent by weight, relative to the total solids of said coating solution; (ii) a sufficient amount of at least one radiation-sensitive compound to impart radiation sensitivity to said coating solution; and (iii) an organic solvent present in an amount sufficient to solubilize said binder, which organic solvent consists essentially of a monomethyl ether of 1,2 propanediol in an amount of between about 80% and 100% by weight of said organic solvent, such that said light-sensitive layer contains, after drying, about 1% of said organic solvent.

10. A photoresist material as claimed in claim 9, wherein said organic solvent consists essentially of said ether.

11. A photoresist material as claimed in claim 10, wherein said organic solvent consists of said ether.

12. A photoresist material as claimed in claim 9, wherein said organic solvent comprises 1-methoxypropane-2-ol.

13. A photoresist material according to claim 9, wherein said organic solvent further consists essentially of a second, higher-boiling organic solvent, such that up to 2% of said higher-boiling solvent remains in said layer after drying.

* * * * *

UNITED STATES PATENT AND TRADEMARK OFFICE
CERTIFICATE OF CORRECTION

PATENT NO. : 4,764,450
DATED : August 16, 1988
INVENTOR(S) : RUCKERT et al.

It is certified that error appears in the above—identified patent and that said Letters Patent is hereby corrected as shown below:

Column 3, line 16, after "esters", delete ", e.g., 3-methoxy-butyl acetate"

Signed and Sealed this

Twenty-eighth Day of March, 1989

Attest:

DONALD J. QUIGG

Attesting Officer

Commissioner of Patents and Trademarks